United States Patent
Wu et al.

(10) Patent No.: US 12,387,953 B2
(45) Date of Patent: Aug. 12, 2025

(54) PROCESSING TASK START METHOD AND DEVICE IN SEMICONDUCTOR PROCESSING APPARATUS

(71) Applicant: BEIJING NAURA MICROELECTRONICS EQUIPMENT CO., LTD., Beijing (CN)

(72) Inventors: Fangna Wu, Beijing (CN); Sixue Shi, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 427 days.

(21) Appl. No.: 18/041,087

(22) PCT Filed: Jul. 26, 2021

(86) PCT No.: PCT/CN2021/108333
§ 371 (c)(1),
(2) Date: Feb. 9, 2023

(87) PCT Pub. No.: WO2022/033292
PCT Pub. Date: Feb. 17, 2022

(65) Prior Publication Data
US 2023/0307272 A1    Sep. 28, 2023

(30) Foreign Application Priority Data
Aug. 14, 2020  (CN) .......................... 202010821443.2

(51) Int. Cl.
*H01L 21/67* (2006.01)
*H01L 21/02* (2006.01)

(52) U.S. Cl.
CPC .. *H01L 21/67253* (2013.01); *H01L 21/02057* (2013.01); *H01L 21/67207* (2013.01); *H01L 21/67276* (2013.01)

(58) Field of Classification Search
CPC ......... H01L 21/67253; H01L 21/02057; H01L 21/67207; H01L 21/67276;
(Continued)

(56) References Cited

U.S. PATENT DOCUMENTS

| | | | |
|---|---|---|---|
| 6,122,566 A | 9/2000 | Nguyen et al. | |
| 6,336,204 B1 | 1/2002 | Jevtic | |
| 6,466,835 B1 | 10/2002 | Ishizawa et al. | |

FOREIGN PATENT DOCUMENTS

| | | |
|---|---|---|
| CN | 107346750 A | 11/2017 |
| CN | 108762002 A | 11/2018 |

(Continued)

OTHER PUBLICATIONS

The World Intellectual Property Organization (WIPO) International Search Report for PCT/CN2021/108333 Oct. 11, 2021 5 Pages (including translation).

*Primary Examiner* — Davienne N Monbleau
*Assistant Examiner* — John Patrick Cornely
(74) *Attorney, Agent, or Firm* — ANOVA LAW GROUP, PLLC

(57) ABSTRACT

The present disclosure provides a start method and device of a processing task in a semiconductor processing apparatus. The method includes generating a processing area relationship list of a current processing task of the semiconductor processing apparatus; determining all to-be-started processing tasks and generating a processing area relationship list for each of the to-be-started processing tasks, based on the processing area relationship list of the current processing task and the processing area relationship list of each of the to-be-started processing task, determining whether all the
(Continued)

to-be-started processing tasks include a startable processing task according to a first predetermined rule, when all the to-be-started processing tasks include a startable processing task, selecting a target startable processing task from all startable processing tasks according to a second predetermined rule, and starting the target startable processing task.

10 Claims, 7 Drawing Sheets

(58) Field of Classification Search
CPC ... H01L 21/67028; G06Q 10/06; Y02P 90/02; G05B 19/41865; G05B 19/4187
See application file for complete search history.

(56) References Cited

FOREIGN PATENT DOCUMENTS

| | | | |
|---|---|---|---|
| CN | 111475308 | A | 7/2020 |
| CN | 111933517 | A | 11/2020 |
| JP | H10189687 | A | 7/1998 |
| JP | 2002506285 | A | 2/2002 |
| JP | 2003100585 | A | 4/2003 |
| JP | 2013097496 | A | 5/2013 |
| JP | 2017117930 | A | 6/2017 |
| TW | 201946185 | A | 12/2019 |

PROCESSING TASK START METHOD AND DEVICE IN SEMICONDUCTOR PROCESSING APPARATUS

CROSS-REFERENCE TO RELATED APPLICATIONS

This application is a national phase entry under 35 U.S.C. § 371 of International Application No. PCT/CN2021/108333, filed on Jul. 26, 2021, which claims priority to Chinese Application No. 202010821443.2 filed on Aug. 14, 2020, the entire contents of both of which are incorporated herein by reference.

TECHNICAL FIELD

The present disclosure generally relates to the semiconductor apparatus technology field and, more particularly, to a processing task start method and a processing task start device in a semiconductor processing apparatus.

BACKGROUND

A deadlock situation is an abnormal situation that has a greatest impact on the work efficiency of a semiconductor processing apparatus when multitasking is performed in the semiconductor processing apparatus such as a wafer cleaning apparatus. The deadlock situation will cause downtime of the semiconductor processing apparatus, impact the yield of the semiconductor processing apparatus, and cause the semiconductor processing apparatus to fail to work normally.

Taking the wafer cleaning apparatus as an example, for a first task and a second task with start times, a positive sequence of RouteRecipe of the first task is represented as Shelf-PDO1/PDO2-WTC-IOBuffer-Tank1-Tank2-Tank7-Tank8-Dry-WTC-PDO1/PDO2-Shelf. An out-of-order sequence of RouteRecipe of the second task is expressed as Shelf-PDO1/PDO2-WTC-IOBuffer-Tank7-Tank8-Tank1-Tank2-Dry-WTC-PDO1/PDO2-Shelf. For the first task, a material in Tank2 needs to be transferred to Tank7. For the second task, a material in Tank8 needs to be transferred to Tank1. Due to an acid-water binding rule, Tank1 and Tank2 belong to a same processing area, Tank7 and Tank8 belong to a same processing area. Only one material can exist in the same processing area. The material can be at least a group of wafers (also referred to as wafers).

For the first task, since the material in Tank8 is located in the processing area formed by Tank7 and Tank8, and the processing area is being occupied by Tank8, the material in Tank2 cannot be transferred to Tank7 in the processing area formed by Tank7 and Tank8. Similarly, for the second task, since the material in Tank2 is located in the processing area formed by Tank1 and Tank2, and the processing area is being occupied by Tank2, the material in Tank8 cannot be transferred to Tank1 in the processing area formed by Tank2 and Tank1, which causes the deadlock situation.

It is desired to solve the problem to avoid the above deadlock situation under the acid-water binding rule.

SUMMARY

In order to overcome the problems existing in the art, the present disclosure provides a processing task start method and device in a semiconductor processing apparatus, which can solve the deadlock situation.

According to a first aspect of embodiments of the present disclosure, the processing task start method in the semiconductor processing apparatus is provided and includes:
  generating a processing area relationship list of a current processing task of the semiconductor processing apparatus, wherein the processing area relationship list of the current processing task includes processing area group identifications of all processing area groups associated with the current processing task;
  determining all to-be-started processing tasks and generating a processing area relationship list for each of the to-be-started processing tasks, wherein the processing area relationship list of the to-be-started processing task includes the processes of processing area group identifications of all processing area groups associated with the to-be-started processing task;
  based on the processing area relationship list of the current processing task and the processing area relationship list of each of the to-be-started processing tasks, determining whether all the to-be-started processing tasks include a startable processing task according to a first predetermined rule; and
  when all the to-be-started processing tasks include the startable processing task, selecting a target startable processing task from all startable processing tasks according to a second predetermined rule and starting the target startable processing task.

According to a second aspect of embodiments of the present disclosure, the processing task start device in the semiconductor processing apparatus is provided and includes:
  a generation unit configured to generate a processing area relationship list of a current processing task of the semiconductor processing apparatus, wherein the processing area relationship list of the current processing task includes processing area group identifications of all processing area groups associated with the current processing task;
  a first determination unit configured to determine all to-be-started processing tasks and generate a processing area relationship list for each of the to-be-started processing tasks, wherein the processing area relationship list of the to-be-started processing task includes the processes of processing area group identifications of all processing area groups associated with the to-be-started processing task;
  a second determination unit configured to, based on the processing area relationship list of the current processing task and the processing area relationship list of each of the to-be-started processing tasks, determine whether all the to-be-started processing tasks include a startable processing task according to a first predetermined rule; and
  a start unit configured to, when all the to-be-started processing tasks include the startable processing task, select a target startable processing task from all startable processing tasks according to a second predetermined rule and start the target startable processing task.

The processing task start method and device in the semiconductor processing apparatus provided by embodiments of the present disclosure realize using the processing area group identifications to identify the situation that the materials in different processing tasks appear in the same processing area and in the opposite sequence. In the process where the target startable processing task and the current processing task that have neighboring start moments are running parallelly in the semiconductor processing apparatus, situations of all possible materials appearing in the two same processing areas and in the opposite sequence are considered.

In the process of ensuring that the target startable processing task and the current processing task that have the neighboring start moments are running in parallel in the semiconductor processing apparatus. Thus, the deadlock situation does not occur at any time.

BRIEF DESCRIPTION OF THE DRAWINGS

The accompanying drawings, which are incorporated in and form a part of the specification, illustrate embodiments consistent with the present disclosure and together with the specification are used to explain the principle of the present disclosure.

DETAILED DESCRIPTION OF THE EMBODIMENTS

Figure 1:
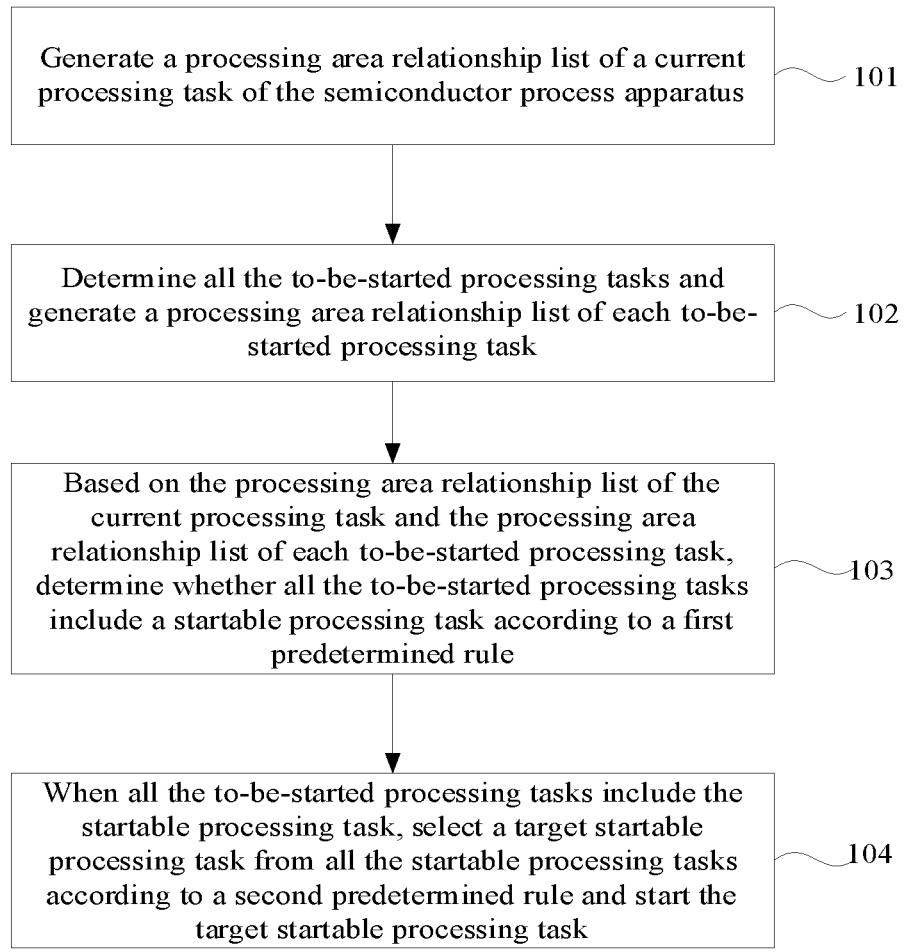
FIG. 1 illustrates a schematic flowchart of a processing task start method in a semiconductor processing apparatus according to a first embodiment of the present disclosure.

The present disclosure is further described in detail below with reference to the accompanying drawings and embodiments. It should be understood that specific embodiments described herein are only used to explain the related disclosure, but not to limit the present disclosure. In addition, it should be noted that, to facilitate description, only parts related to the present disclosure are shown in the drawings.

It needs to be noted that embodiments of the present disclosure and features of embodiments can be combined with each other when there is no conflict. The present disclosure is described in detail below with reference to the accompanying drawings and in connection with embodiments of the present disclosure.

FIG. 1 illustrates a schematic flowchart of a processing task start method in a semiconductor processing apparatus according to a first embodiment of the present disclosure. The method includes:

At 101, generating a processing area relationship list of a current processing task of the semiconductor process apparatus.

An example structure of a wafer cleaning apparatus or a cleaning machine, which can implement the processing task start method of embodiments of the present disclosure, is firstly described.

The cleaning machine can include a Station module set. The Station module set can be represented as {shelf1, shelf2, shelf3, shelf4, shelf5, shelf6, shelf7, shelf8, shelf9, shelf10, shelf11, shelf12, shelf13, shelf14, shelf15, shelf16, PDO1, PDO2}.

The Shelf can be configured to temporarily store a Foup. A Foup can store a group of Wafers (wafer or wafer chip). At most one Foup can be arranged on each Shelf. The Shelf has a sensor, which can detect a number of Foup (0 or 1). The cleaning machine can include a total of 16 Shelfs and can store up to 16 Foups.

A PDO can be used to implement opening and closing Foup gate and perform a Mapping (scanning) function. When a material such as a group of wafers enters the cleaning machine and is placed on the PDO, the PDO can perform a gate opening operation to perform Mapping verification on the wafer chips (i.e. wafers) in the Foup to avoid material residues and abnormal placement of the wafers.

The cleaning machine can include a plurality of Tank modules arranged in sequence. The Tank modules can be referred to as processing units. For the cleaning machine, the Tank modules can also be referred to as processing tanks. A Tank module set can be represented as {Tank1(T1), Tank2 (T2), Tank3(T3), Tank4(T4), Tank5(T5), Tank6(T6), Tank7 (T7), Tank8(T8), Dry, WTC, IOBuffer, EEWD}.

The Tank module can be configured to perform a processing operation on at least one group of Wafers that are used as materials. At maximum, two groups of Wafers can be arranged in each Tank module. All types of Tank modules can include a hazardous processing unit (Critical Tank) and a conventional processing unit (Rinse Tank). A material in the critical tank can have a high processing precision requirement. The critical tank can be an acid processing unit that does not allow over-foaming. The rinse tank can be an acid processing unit that allows over-foaming, a water processing unit, Dry, IOBuffer, WTC, EEWD, etc.

Dry can be a drying processing unit and configured to perform a drying processing operation on a material to ensure that the material is dry after the processing task (i.e., job) is completed. IOBuffer can be configured to perform an Align calibration operation on the material. WTC can be configured to combine the materials of the same task and place the materials in a Tank to perform a processing operation simultaneously. EEWD can be configured to perform a handwashing operation on a manipulator that grabs the materials in different acid tanks to reduce contamination of the manipulator to acids in different acid processing units.

The cleaning machine can include a FoupRobot, a wafer handling robot (WHR) robot, a wafer transferring robot (WTR), and a plurality of DualLifter robots. The Foup Robot (FR) can be a manipulator configured to transfer the Foup. The FR can move in both directions between the Shelf and the PDO and grab one Foup at a time. The WHR can be a manipulator configured to transfer the dry material. The WHR can move in both directions between the PDO and the WTC and grab a group of wafers at a time. The WTR can be configured to transfer the wet material between tanks without dual-tank robots (Duallifter). The WTR can move in both directions between two tank modules without the Duallifters. The WTR can grab two groups of wafers at a time. The Duallifter can be a manipulator configured to transfer the wet material. The Duallifter can move in both directions between two fixed tanks corresponding to the Dualliter. The Duallifter can grab two groups of wafers at a time.

Further, the processing task start method of embodiments of the present disclosure can be applied to a first type of cleaning machine or a second type of cleaning machine. The first type of cleaning machine can also be referred to as a first cleaning machine. The second type of cleaning machine can also be referred to as a second cleaning machine.

Figure 2:
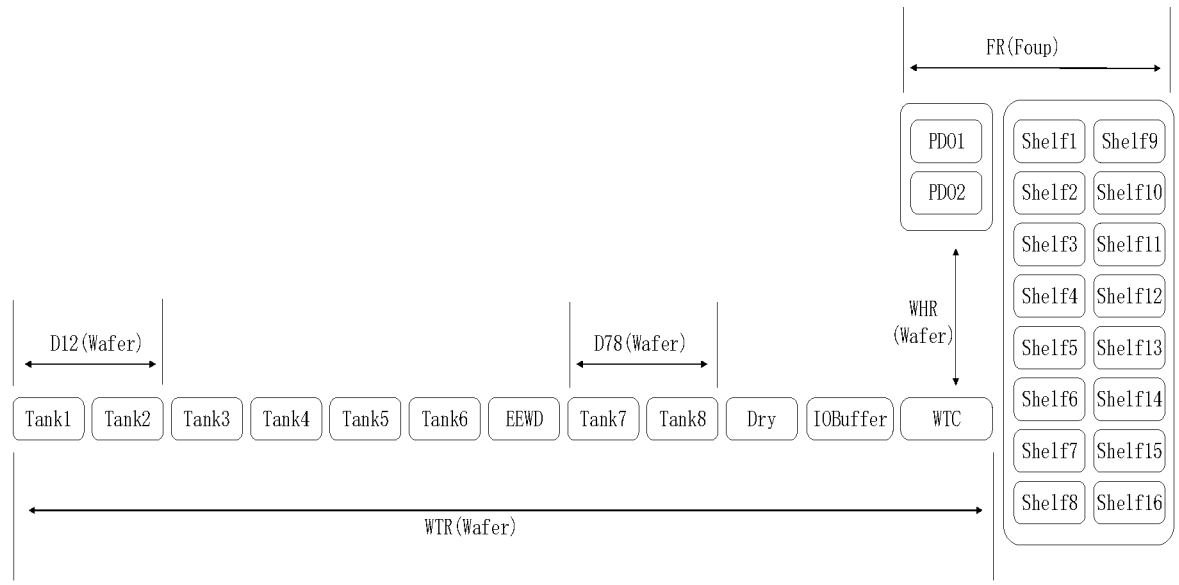
FIG. 2 illustrates a schematic exemplary structural diagram of a first cleaning machine.

With reference to FIG. 2, which illustrates a schematic exemplary structural diagram of the first cleaning machine.

In the first cleaning machine, the acid processing unit set includes Tank1, Tank3, Tank4, and Tank7. The water processing unit set includes Tank2, Tank5, Tank6, and Tank8. Dry is the drying processing unit. Material transfer between Tank1 and Tank2 and material transfer between Tank7 and Tank8 are performed by a corresponding Duallifter. Material transfer between the rest of the tanks can be performed by the WTR.

The critical tank set of the first cleaning machine can be represented as {T1, T3, T4, T7}. The rinse tank set in the first cleaning machine can be represented as {T2, T5, T6, T8, Dry, IOBuffer, WTC, EEWD}.

The first cleaning machine can include 5 robots. A robot set of the first cleaning machine can be represented as {FR, WTR, WHR, Duallifter12(D12), Duallifter78(D78)}. D12 can be configured to transfer the material between Tank1 and Tank2. D78 can be configured to transfer the material between Tank7 and Tank8.

A processing route of the job of the first cleaning machine can include the following processing routes, where parallel can be represented by "/," and "/" can indicate that the path can include one of the two.

Full Duallifter RouteRecipe:
    Shelf-PDO1/PDO2-WTC-IOBuffer-Tank1-Tank2-Tank7-Tank8-Dry-WTC-PDO1/PDO2-Shelf.

Single Duallifter RouteRecipe:
    Shelf-PDO1/PDO2-WTC-IOBuffer-Tank1-Tank2-Dry-WTC-PDO1/PDO2-Shelf;
    Shelf-PDO1/PDO2-WTC-IOBuffer-Tank7-Tank8-Dry-WTC-PDO1/PDO2-Shelf.

Serial Full RouteRecipe:
    Shelf-PDO1/PDO2-WTC-IOBuffer-Tank1-Tank2-Tank3-Tank4-Tank5-Tank6-Tank7-Tank8-Dry-WTC-PDO1/PDO2-Shelf;
    Shelf-PDO1/PDO2-WTC-IOBuffer-Tank1-Tank2-Tank3-Tank5-Tank7-Tank8-Dry-WTC-PDO1/PDO2-Shelf;
    Shelf-PDO1/PDO2-WTC-IOBuffer-Tank1-Tank2-Tank4-Tank6-Tank7-Tank8-Dry-WTC-PDO1/PDO2-Shelf.

Parallel Full RouteRecipe:
    Shelf-PDO1/PDO2-WTC-IOBuffer-Tank1-Tank2-Tank3/Tank4-Tank5/Tank6-Tank7-Tank8-Dry-WTC-PDO1/PDO2-Shelf Tank3 Tank4 Serial, Tank5 Tank6 Parallel RouteRecipe:
    Shelf-PDO1/PDO2-WTC-IOBuffer-Tank1-Tank2-Tank3-Tank4-Tank5/Tank6-Tank7-Tank8-Dry-WTC-PDO1/PDO2-Shelf;
    Shelf-PDO1/PDO2-WTC-IOBuffer-Tank1-Tank2-Tank3-Tank5/Tank6-Tank7-Tank8-Dry-WTC-PDO1/PDO2-Shelf;
    Shelf-PDO1/PDO2-WTC-IOBuffer-Tank1-Tank2-Tank4-Tank5/Tank6-Tank7-Tank8-Dry-WTC-PDO1/PDO2-Shelf.

Tank3 Tank4 Parallel, Tank5 Tank6 Serial RouteRecipe:
    Shelf-PDO1/PDO2-WTC-IOBuffer-Tank1-Tank2-Tank3/Tank4-Tank5-Tank6-Tank7-Tank8-Dry-WTC-PDO1/PDO2-Shelf;
    Shelf-PDO1/PDO2-WTC-IOBuffer-Tank1-Tank2-Tank3/Tank4-Tank5-Tank7-Tank8-Dry-WTC-PDO1/PDO2-Shelf;
    Shelf-PDO1/PDO2-WTC-IOBuffer-Tank1-Tank2-Tank3/Tank4-Tank6-Tank7-Tank8-Dry-WTC-PDO1/PDO2-Shelf.

Specific PDO RouteRecipe:
    Shelf-PDO1- . . . -PDO1-Shelf;
    Shelf-PDO1- . . . -PDO2-Shelf.

In an out-of-order RouteRecipe, for example, Shelf-PDO1/PDO2-WTC-IOBuffer-A-C-B-Dry-WTC-PDO1/PDO2-Shelf, A, C, and B can identifications indicating that processing operations are performed in the processing area to which the processing unit belongs.

In a PDO combination mode, all jobs can specify a single PDO. All the jobs can use parallel PDO (PDO1/PDO2).

Figure 3:
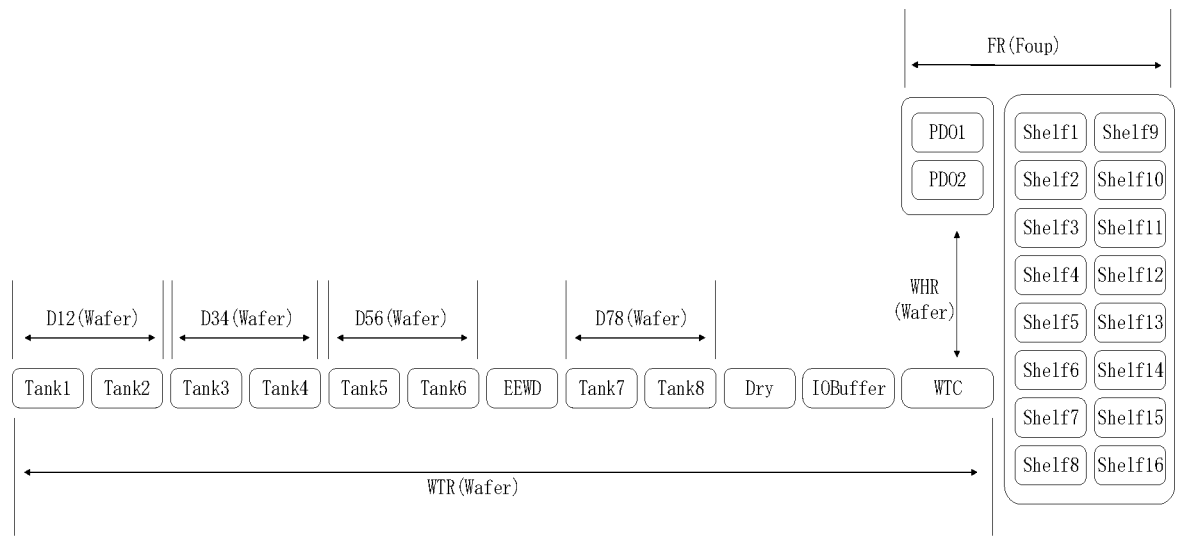
FIG. 3 illustrates a schematic exemplary structural diagram of a second cleaning machine.

With reference to FIG. 3, which illustrates a schematic exemplary structural diagram of a second cleaning machine.

In the second cleaning machine, Tank1, Tank3, Tank5, and Tank7 are acid processing units. Tank2, Tank4, Tank6, and Tank8 are water processing units. The material transfer between Tank1 and Tank2, the material transfer between Tank3 and Tank4, the material transfer between Tank5 and Tank6, and the material transfer between Tank7 and Tank8 are all handled by the corresponding Duallifters.

A critical tank set of the second cleaning machine can be represented as {T1, T3, T5, T7}. The rinse tank set of the second cleaning machine can be represented as {T2, T4, T6, T8, Dry, IOBuffer, WTC, EEWD}. The second cleaning machine can include 7 robots. A robot set of the second cleaning machine can be represented as {FR, WTR, WHR, D12, Duallifter34 (D34), Duallifter56 (D56), D78}. D34 can be configured to transfer the material between Tank3 and Tank4. D56 can be configured to transfer the material between Tank5 and Tank6.

A processing route of the job of the second cleaning machine can include the following processing routes.

Full RouteRecipe: Shelf-PDO1/PDO2-WTC-IOBuffer-Tank1-Tank2-Tank3-Tank4-Tank5-Tank6-Tank7-Tank8-Dry-WTC-PDO1/PDO2-Shelf Single Duallifter RouteRecipe:
    Shelf-PDO1/PDO2-WTC-IOBuffer-Tank1-Tank2-Dry-WTC-PDO1/PDO2-Shelf;
    Shelf-PDO1/PDO2-WTC-IOBuffer-Tank3-Tank4-Dry-WTC-PDO1/PDO2-Shelf;
    Shelf-PDO1/PDO2-WTC-IOBuffer-Tank5-Tank6-Dry-WTC-PDO1/PDO2-Shelf;
    Shelf-PDO1/PDO2-WTC-IOBuffer-Tank7-Tank8-Dry-WTC-PDO1/PDO2-Shelf.

Specific PDO RouteRecipe:
    Shelf-PDO1- . . . -PDO1-Shelf;
    Shelf-PDO1- . . . -PDO2-Shelf.

In an out-of-order RouteRecipe, such as Shelf-PDO1/PDO2-WTC-IOBuffer-B-C-A-D-Dry-WTC-PDO1/PDO2-Shelf, B, C, A, and D can be identifications indicating that the processing operation is performed in the processing area where the processing unit belongs.

A PDO combination mode can include that all jobs specify a single PDO, and all jobs use parallel PDO (PDO1/PDO2).

In some embodiments, the processing task can be referred to as a job. The current job may refer to a job with a latest start time among all the jobs that have been started but not completed. The current job can also be referred to as the job that is started most recently. Each time a target startable job can be determined. The target startable job can be started. The determined target startable job can become the current job.

The processing area relationship list of the current job in the semiconductor processing apparatus can be referred to as routeRegionSort. The processing route of the task can be referred to as RouteRecipe.

In some embodiments, the current processing task can be one of a processing task being performed by the semiconductor process apparatus and a processing task newly started by the semiconductor process apparatus.

When the current processing task is the processing task being performed by the semiconductor process apparatus, the current processing task can refer to the task whose specified material is being processed in the processing unit and has a latest start time. When the current processing task is a processing task newly started by the semiconductor process apparatus, the current processing task can refer to a task that has been started with the specified material not leaving the Foup and has the latest start time.

When the target startable job is determined, the specified material of the current job may have already left the Foup, and the specified material of the current job may be processed in the processing unit. Thus, the current job can be referred to as the current job that is being processed in the Tank.

When the target startable job is determined, the specified material of the current job may not have left the Foup. Thus, the current job can be referred to as a newly started job.

In some embodiments, taking the above cleaning machine as an example, the processing area can refer to an area including at least one acid processing unit and at least one water processing unit. The processing area can also be referred to as an acid-water processing area.

In some embodiments, a plurality of processing units can be divided into a plurality of processing areas. Specifically, each processing unit can belong to one processing area. The plurality of processing units can all belong to a same processing area.

For example, Tank1-Tank2 can belong to processing area A, Tank3-Tank6 can belong to processing area B, and Tank7-Tank8 can belong to processing area C.

Processing area relationship list routeRegionSort of the current job can include processing area group identifications of all the processing area groups associated with the current processing task.

The processing area group identification of processing area relationship list routeRegionSort can be obtained by combining the processing area identifications of the processing areas associated with the current processing task.

The current job can include a series of processing operations performed in sequence for the material. Each processing operation can be performed in a processing unit.

The processing route RouteRecipe of the current job can describe the sequence of the processing units that perform the processing operations in the current job.

In some embodiments, when the current job is performed, the processing unit that performs the processing operation on the material can be referred to as a current job-associated processing unit.

In some embodiments, the current job-associated processing area can refer to, when the current job is performed, the processing area to which the processing unit that performs the process operation on the material belongs.

In some embodiments, the plurality of processing area groups of the semiconductor processing apparatus can be obtained by combining the plurality of processing areas of the semiconductor process apparatus.

The current job-associated processing area group can refer to a processing area group formed by two processing areas associated with the current job of the plurality of processing area groups of the semiconductor process apparatus.

In some embodiments, for each processing area group associated with the current job, according to a timing relationship of a moment when the material leaves the current job-associated processing area when the current job is performed, a before-after relationship of the two processing areas associated with the current job can be determined in the processing area group.

For a processing area group associated with the current job, when the current job is performed, if the moment when the material leaves a processing area of the processing area group is earlier than the moment when the material leaves another processing area of the processing area group, the before-after relationship of the two processing areas of the processing area group can be the one processing area is at first, and the another processing area is at second.

In some embodiments, for each processing area associated with the current job, if the before-after relationship of the two processing areas of the processing area group in the current job is consistent with the before-after relationship of the two processing areas in the semiconductor process apparatus, the processing area group can be regarded as in a positive sequence state in the current job. If the before-after relationship of the two processing areas of the processing area group in the current job is not consistent with the before-after relationship of the two processing areas in the semiconductor process apparatus, the processing area group can be regarded as in a reverse sequence state in the current job.

It should be understood that the state of the processing area group is relative to the processing task. The state of the same processing area group can be the same or different in two different processing tasks.

For example, the full route of the current job can be Shelf-PDO1/PDO2-WTC-IOBuffer-Tank1-Tank2-Tank3-Tank4-Tank5-Tank6-Tank7-Tank8-Dry-WTC-PDO1/PDO2-Shelf.

According to the moment of the processing operation performed on the specified material of the current job, the sequence can be formed from early to late as Tank1, Tank2, Tank3, Tank4, Tank5, Tank6, Tank7, and Tank8. That is, the processing operation can be first performed on the specified material of the current job in Tank1. Then, the processing operation can be performed on the specified material of the current job in Tank2, and so on.

All processing units associated with the current job can include Tank1, Tank2, Tank3, Tank4, Tank5, Tank6, Tank7, and Tank8.

The sequence of the moment of performing the processing operation on the specified material of the current job from early to late can be Tank1, Tank2, Tank3, Tank4, Tank5, Tank6, Tank7, and Tank8.

Tank1-Tank2 belong to processing area A, Tank3-Tank6 belong to processing area B, and Tank7-Tank8 belong to processing area C.

In the semiconductor process apparatus, the sequence of the processing areas from front to back can be processing area A, processing area B, and processing area C.

All the processing areas associated with the current job can include processing area A, processing area B, and processing area C.

All the processing areas associated with the current job can be arranged in a sequence from early to late according to the moment when the material leaves, which is processing area A, processing area B, and processing area C.

That is, all the processing areas associated with the current job can be in the sequence of processing area A, processing area B, and processing area C.

All the processing area groups associated with the current job can include a processing area group including processing area A and processing area B, a processing area group including processing area A and processing area C, and a processing area group including processing area B and processing area C.

In the processing area group including processing area A and processing area B, when the current job is performed, the moment when the material leaves processing area A can be earlier than the moment when the material leaves processing area B. Therefore, the before-after relationship of processing area A and processing area B in the current job can be processing area A before processing area B. The before-after relationship of processing area A and processing area B of the processing area group in the current job can be consistent with the before-after relationship of processing area A and processing area B in the semiconductor processing apparatus. Thus, the processing area group including processing area A and processing area B can be in the positive sequence state in the current job.

In the processing area group including processing area A and processing area C, the before-after relationship between processing area A and processing area C in the current job can be that processing area A is before processing area C. The before-after relationship of processing area A and processing area C of the processing area group can be consistent with the before-after relationship of processing area A and processing area C of the processing area group. Thus, the processing area group including processing area A and processing area C can be in the positive sequence state in the current job.

In the processing area group including processing area B and processing area C, the before-after relationship between processing area B and processing area C in the current job can be that processing area B is before processing area C. The before-after relationship of processing area B and processing area C of the processing area group can be consistent with the before-after relationship of processing area B and processing area C of the processing area group. Thus, the processing area group including processing area B and processing area C can be in the positive sequence state in the current job.

For example, the full route of the current job can be Shelf-PDO1/PDO2-WTC-IOBuffer-Tank1-Tank2-Tank7-Tank8-Tank3-Tank4-Tank5-Tank6-Dry-WTC-PDO1/PDO2-Shelf.

In the semiconductor process apparatus, the sequence of all the processing units from front to back can be Tank1, Tank2, Tank3, Tank4, Tank5, Tank6, Tank7, and Tank8, All the processing units associated with the current job can include Tank1, Tank2, Tank3, Tank4, Tank5, Tank6, Tank7, and Tank8.

The sequence of the moment from early to late when the processing operation is performed on the specified material of the current job can be Tank1, Tank2, Tank7, Tank8, Tank3, Tank4, Tank5, and Tank6.

Tank1-Tank2 belong to processing area A, Tank3-Tank6 belong to processing area B, and Tank7-Tank8 belong to processing area C.

All the processing areas associated with the current job can include processing area A, processing area B, and processing area C.

All the processing areas associated with the current job can be arranged in a sequence from early to late according to the moment when the material leaves the processing areas, such as processing area A, processing area C, and processing area B.

That is, all the processing areas associated with the current job can include processing area A, processing area C, and processing area B in sequence.

All the processing area groups associated with the current job can include the processing area group including processing area A and processing area B, the processing area group including processing area A and processing area C, and the processing area group including processing area C and processing area B.

In the processing area group including processing area A and processing area B, the before-after relationship of processing area A and processing area B in the current job can be that processing area A is before processing area B. The before-after relationship of processing area A and processing area B of the processing area group in the current job can be consistent with the before-after relationship of processing area A and processing area B in the semiconductor processing apparatus. Thus, the processing area group including processing area A and processing area B can be in the positive sequence state in the current job.

In the processing area group including processing area A and processing area C, the before-after relationship of processing area A and processing area C in the current job can be that processing area A is before processing area C. The before-after relationship of processing area A and processing area C of the processing area group in the current job can be consistent with the before-after relationship of processing area A and processing area C in the semiconductor processing apparatus. Thus, the processing area group including processing area A and processing area C can be in the positive sequence state in the current job.

In the processing area group including processing area C and processing area B, when the current job is performed, the moment when the material leaves processing area C is earlier than the moment when the material leaves processing area B. Therefore, the before-after relationship of processing area C and processing area B can be that processing area C is before processing area B. The before-after relationship of processing area C and processing area B in the processing area group cannot be consistent with the before-after relationship of processing area B and processing area C in the semiconductor processing apparatus. Therefore, the processing area group including processing area C and processing area B can be in the reverse sequence state in the current job.

In some embodiments, to generate the processing area relationship list of the current processing task in the semiconductor processing apparatus, a processing unit identification sequence of the current job can be generated first.

The processing unit identification sequence of the current job can include an identification of each processing unit related to the current job.

In the processing unit identification sequence of the current job, the sequence of the processing unit identifications can be consistent with the sequence in which the processing operations are performed by the processing units described in the processing route of the current job.

For example, the processing route of the current job can be Tank3-Tank4-Tank5-Tank6-Tank7-Tank8-Dry-WTC-PDO1/PDO2-Shelf. The current job can be associated with a plurality of processing units, such as Tank3 configured to perform the processing operation, Tank4 configured to perform the processing operation, Tank5 configured to perform the processing operation, Tank6 configured to perform the processing operation, Tank7 configured to perform the processing operation, and Tank8 configured to perform the processing and other processing units. The processing unit identification sequence of the current job can include processing unit identification T3 of Tank3, processing unit identification T4 of Tank4, processing unit identification T5 of Tank5, processing unit identification T6 of Tank6, processing unit identification T7 of Tank7, and processing unit identification T8 of Tank8. Processing unit identification T3 of Tank3 can be a first processing unit identification of the processing unit identification sequence of the current job. Processing unit identification T4 of Tank4 can be a second processing unit identification of the processing unit identification sequence of the current job, and so on.

In some embodiments, in order to generate the processing area relationship list of the current job in the semiconductor process apparatus, after the processing unit identification sequence of the current job is generated, the processing unit identification sequence of the current job can be traversed. A processing unit identification sequence of the current job formed by the processing area identifications of the plurality of processing areas related to the current job can be generated each time a processing unit identification is accessed in the traversing process. All the processing area identifications of the processing area identification sequence of the current job can be equivalent to being obtained by combining the identification of the processing area to which each processing unit associated with the current job belongs and then performing deduplication.

First, the first processing unit identification in the processing unit identification sequence of the current job can be accessed. Then, the second processing unit identification in the processing unit identification sequence of the current job can be accessed, and so on.

When a processing unit identification is accessed, and if the processing unit with the processing unit identification and a processing unit corresponding to a next processing unit identification belong to different processing areas, a processing area identification of the processing area to which the processing unit having the processing unit identification belongs can be generated first. Then, a processing area identification of a processing area to which the processing unit having the next processing unit identification can be generated.

Each processing area can have a processing area identification. For example, the processing area identification of processing area A can be A, the processing area identification of processing area B can be B, and the processing area identification of processing area C can be C.

When the processing unit to which each processing unit identification of a plurality of processing unit identifications in consecutive positions that are accessed belongs to a same processing area, only one processing area identification can be generated, that is, the processing area identification of the same processing area. Until a processing unit identification whose processing area is different from the processing area of each processing unit identification of the plurality of processing unit identifications in the consecutive positions is accessed, a processing area identification of the processing area to which the processing unit identification belongs can be generated.

All the generated processing area identifications may form the processing area identification sequence of the current Job. In the processing area identification sequence of the current job, the sequence of all the processing area identifications can be the sequence of the generation time of the processing area identifications from early to late.

The sequence of all the processing area identifications in the processing area identification sequence of the current job can be the sequence obtained by sorting all the processing areas associated with the current job according to the moment when the material leaves the processing area from early to late.

After the processing area identification sequence of the current job is generated, the processing area identifications in the generated processing area identification sequence can be combined in a predetermined positive sequence combination manner to obtain at least one processing area group identification. The positive sequence can be a processing unit setting sequence.

For each processing area identification of the processing area identification sequence, if the processing area identification is not the last processing area identification in the processing area identification sequence, the processing area identification can be combined with each processing area identification located after the processing area identification to obtain all processing area group identification corresponding to the processing area identification.

For each processing area identification of the processing area identification sequence, in all the processing area group identifications corresponding to the processing area identification, the processing area identification can be located before a processing area identification after the processing area identification.

After obtaining all the processing area group identifications corresponding to each processing area identification in the processing area identification sequence, all the processing area group identifications corresponding to each processing area identification in the processing area identification sequence can be combined into the processing area relationship list of the current processing task.

Taking the first cleaning machine as an example, for example, the processing unit identification sequence of the current job can include processing unit identification T3 of Tank3, processing unit identification T4 of Tank4, processing unit identification T5 of Tank5, processing unit identification T6 of Tank6, processing unit identification T7 of Tank7, and processing unit identification T8 of Tank8. Tank3-Tank6 can belong to processing area B. Tank7-Tank8 can belong to processing area C.

Processing unit identification T3 of Tank3, processing unit identification T4 of Tank4, the processing unit identification T5 of Tank5, and processing unit identification T6 of Tank6 can be accessed in sequence. T3, T4, T5, and T6 can be a plurality of processing unit identifications in consecutive positions. Tank3-Tank6 can belong to processing area B. Thus, only identification B of processing area B can be generated.

Processing unit Tank6 to which T6 belongs can be different from Tank7. When processing unit identification T7 of Tank7 is accessed, processing area identification C of processing area C can be generated. The processing unit identification of Tank7 and the processing unit identification of Tank8 can be accessed in sequence. T7 and T8 can be a plurality of processing unit identifications in consecutive positions. Since Tank7-Tank8 belong to processing area C, only processing area identification C of processing area C can be generated.

All the generated processing area identifications can include B and C. All the processing area identifications B and C can form the processing area identification sequence of the current job. In the processing area identification sequence of the current job, B can be located before C.

After the processing area identification sequence of the current job is obtained, the processing area identifications of the processing area identification sequence can be combined in a predetermined positive sequence combination manner to obtain at least one processing area group identification. For processing area identification B, processing area identification C can be located after processing area identification B. Processing area identification B and processing area identification C can be combined to obtain processing area group identification BC corresponding to processing area identification B. There are no other processing area identifications after C. Therefore, C cannot be combined with other processing identifications. Thus, the processing area relationship list of the current processing task can include BC.

At 102, all the to-be-started processing tasks are determined, and a processing area relationship list of each to-be-started processing task is generated.

The processing area relationship list of the to-be-started processing task can include the processing area group identifications of all processing area groups associated with the to-be-started processing task.

The process of generating the processing area relationship list of any to-be-started job can be similar to the above process of generating the processing area relationship list of the current processing task in the semiconductor processing apparatus. A processing area relationship list of any one to-be-started job can be generated with reference to the process of generating the processing area relationship list of the current processing task.

For example, the semiconductor processing apparatus can include processing areas such as processing area A, processing area B, processing area C, and processing area D. Tank1-Tank2 can belong to processing area A. Tank3-Tank4 can belong to processing area B. Tank5-Tank6 can belong to processing area C. Tank7-Tank8 can belong to processing area D.

A full route of a to-be-started job can be Shelf-PDO1/PDO2-WTC-IOBuffer-Tank1-Tank2-Tank3-Tank4-Tank5-Tank6-Tank7-Tank8-Dry-WTC-PDO1/PDO2-Shelf.

The processing units associated with the to-be-started job can be sorted in a sequence of Tank1, Tank2, Tank3, Tank4, Tank5, Tank6, Tank7, and Tank8 according to the moment when the process operation is performed on the material from early to late. That is, the processing operation can be performed on the material in Tank1 first, and the processing operation can be then performed on the material in Tank2, and so on.

The plurality of processing areas associated with the to-be-started job can be processing area A, processing area B, processing area C, and processing area D in sequence. The processing area identifications of the plurality of processing areas associated with the to-be-started job can form a processing area identification sequence. The processing area identification sequence can include processing area identification A of processing area A, processing area identification B of processing area B, processing area identification C of processing area C, and processing area identification D of processing area D in sequence.

A can be combined with each of B, C, and D located behind A to obtain processing area group identifications AB, AC, and AD. B can be combined with each of C and D located behind B to obtain processing area group identifications BC and BD. C can be combined with D located behind C to obtain processing area group identification CD.

All the obtained processing area group identifications can form a processing area relationship list of the to-be-started job. The processing area relationship list of the to-be-started job can include AB, AC, AD, BC, BD, and CD.

In some optional implementations of embodiments of the present disclosure, determining all to-be-started processing tasks and generating a processing area relationship list of each to-be-started processing task can include when the current processing task associated with a predetermined processing area of a plurality of processing areas, determining a serial type or a parallel type corresponding to the predetermined processing area of the current processing task, determining to-be-started processing tasks associated with the predetermined processing area of all the to-be-started processing tasks, determining the serial or parallel type corresponding to the predetermined processing area of each to-be-started processing task associated with the predetermined processing area, determining the to-be-started processing task associated with the predetermined processing area and with the serial-parallel type of the predetermined area matching with the serial-parallel type corresponding to the predetermined processing area of the current processing task, and generating a processing area relationship list of each target to-be-started processing task.

In some embodiments, when the current processing task involves a predetermined processing area of the plurality of processing areas, a to-be-started processing task of all the to-be-started processing tasks associated with the predetermined processing area and the serial-parallel type corresponding to the predetermined processing area matching the serial-parallel type corresponding to the predetermined processing area of the current processing task can be referred to as a target to-be-started processing task.

When at least one target to-be-started processing task exists, in a process of generating the processing area relationship list of each to-be-started processing task, the processing area relationship list of each target to-be-started processing task can be preferably generated for a subsequent step.

For a processing task such as the current processing task or any one to-be-started processing task, the serial-parallel type corresponding to the predetermined processing area in the processing task can refer to a serial-parallel type of a sub-route corresponding to the predetermined processing area in the route of the processing task.

For a processing task, such as the current processing task or any one to-be-started processing task, the sub-route corresponding to the predetermined processing area of the route of the processing task can refer to the sub-route of the processing unit associated with the predetermined processing area in the route of the processing task.

Taking the above-mentioned first cleaning machine as an example, the predetermined processing area can be processing area B. When a route of a to-be-started job is a full Duallifter RouteRecipe, the processing route of the to-be-started job cannot include the sub-route corresponding to the predetermined processing area, i.e., processing area B. The serial-parallel type of the sub-route corresponding to processing area B of the processing route of the to-be-started job can be void. Correspondingly, the serial-parallel type corresponding to processing area B of the to-be-started job can be void. Similarly, when the route of the current job is full Duallifter RouteRecipe, the processing route of the current job cannot include the sub-route corresponding to processing area B. The serial-parallel type corresponding to the sub-route of processing area B of the processing route of the current job can be void. Correspondingly, the serial-parallel type corresponding to processing area B of the current job can be void.

Similarly, when the route of a to-be-started job is a single Duallifter RouteRecipe, a processing route of the to-be-started job cannot include a sub-route corresponding to processing area B. The serial-parallel type corresponding to a sub-route of processing area B of the processing route of the to-be-started job can be void. Similarly, when the current job is a single Duallifter RouteRecipe, the processing route of the current job cannot include the sub-route corresponding to the predetermined processing area. The serial-parallel type of the sub-route corresponding to processing area B in the processing route of the current job can be void.

When the route of the to-be-started job is a serial full RouteRecipe, the serial-parallel type of the sub-route corresponding to processing area B in the route of the to-be-started job can include that Tank3 and Tank4 are arranged in series, and Tank5 and Tank6 are arranged in series. Correspondingly, the serial-parallel type corresponding to processing area B in the to-be-started job can include that Tank3 and Tank4 are arranged serially, and Tank5 and Tank6 are arranged serially. Similarly, when the route of the current job is a serial full RouteRecipe, the serial-parallel type of the sub-route corresponding to processing area B in the route of the current job can include that Tank3 and Tank4 are arranged serially, and Tank5 and Tank6 are arranged serially. Correspondingly, the serial-parallel type corresponding to processing area B in the current Job can include that Tank3 and Tank4 are arranged serially, and Tank5 and Tank6 are arranged serially.

When the route of the to-be-started job is a RouteRecipe in which Tank3 and Tank4 are arranged serially, and Tank5 and Tank6 are arranged parallelly, the serial-parallel type of the sub-route corresponding to processing area B in the route of the to-be-started job can include that Tank3 and Tank4 are arranged serially, and Tank5 and Tank6 are arranged parallelly. Similarly, when the route of the current job is a RouteRecipe in which Tank3 and Tank4 are arranged serially, and Tank5 and Tank6 are arranged parallelly, the serial-parallel type of the sub-route corresponding to processing area B in the route of the current job can include that Tank3 and Tank4 are arranged serially, and Tank5 and Tank6 are arranged parallelly.

At 103, based on the processing area relationship list of the current processing task and the processing area relationship list of each to-be-started processing task, whether all the to-be-started processing tasks include a startable processing task is determined according to a first predetermined rule.

In some embodiments, when whether all the to-be-started processing tasks include at least one startable processing task is determined based on the processing area relationship list of the current processing task and the processing area relationship list of each target to-be-started processing task, the first predetermined rule can include if a to-be-started processing task and the current processing task both are associated with a processing area group, and the state of the processing area group in the to-be-started processing task and the current processing task is different, the to-be-started processing task does not belong to the startable processing task, otherwise, the to-be-started processing task belongs to the startable processing task.

The above state can include a positive sequence state and a reverse sequence state. The positive sequence state can indicate that the before-after relationship of the processing area group in the corresponding processing task is consistent with the before-after relationship in the semiconductor processing apparatus. The above reverse sequence state can indicate that the before-after relationship of the processing area group in the corresponding processing task is inconsistent with the before-after relationship in the semiconductor processing apparatus.

For example, if the before-after relationship of a processing area group in the current processing task is consistent with the before-after relationship in the semiconductor processing apparatus, the state of the processing area group in the current processing task can be the positive sequence state. If the before-after relationship of the processing area group in the current processing task is inconsistent with the before-after relationship in the semiconductor processing apparatus, the state of the processing area group in the current processing task can be the reverse sequence state. If a before-after relationship of a processing area group in a to-be-started processing task is consistent with a before-after relationship in the semiconductor processing apparatus, a state of the processing area group in the to-be-started processing task can be the positive sequence state. If the before-after relationship of the processing area group in the to-be-started processing task is inconsistent with the before-after relationship in the semiconductor processing apparatus, the state of the processing area group in the to-be-started processing task can be the reverse sequence state.

Assume that the current processing task involves a specific work area group, and the state of the work area group in the current processing task is the positive sequence state, for each to-be-started processing task, whether the processing area relationship list of the to-be-started processing task includes the specific work area group and the state of the work area group is the reverse sequence state can be determined. If not, the to-be-started processing task can be determined to be able to be used as a startable processing task. If yes, the to-be-started processing task can be determined to not be able to be used as the startable processing task.

The sequence of the processing area identifications in the processing area group identification of the specific work area group is different from the sequence of the processing area identifications of the specific work area group in the current processing task, or the sequence is reversed, which means that the state of the processing area group in the to-be-started processing task and the current processing task is different. Otherwise, the state of the processing area group in the to-be-started processing task and the current processing task can be different.

For example, a plurality of processing areas of the process route of the current processing task can be A, B, and C in sequence. When the current processing task is executed, processing can be performed on the material first in at least one processing unit in processing area A. Then, processing can be performed on the material in at least one processing unit in processing area B. Finally, processing can be performed on the material in at least one processing unit in processing area C.

In the processing area identification list of the current processing task, the processing area identifications can be A, B, and C in a sequence from front to back. The processing area identifications in the processing area identification list can be combined in a predetermined positive sequence combination manner to obtain the processing area relationship list of the current processing task. The processing area relationship list of the current processing task can include AB, AC, and BC.

For a to-be-started processing task, the plurality of processing areas associated with the to-be-started processing task can include A, C, and B in sequence. If the to-be-started processing task is started, processing can be performed on the material first in at least one processing unit in processing area A. Then, processing can be performed on the material in at least one processing unit in processing area C. Finally, processing can be performed on the material in at least one processing unit in processing area B.

In the processing area identification list of the to-be-started processing task, the processing area identifications can include A, C, and B in a sequence from front to back. The processing area identifications in the processing area identification list can be combined in a predetermined positive sequence combination manner to obtain the processing area relationship list of the current processing task. The processing area relationship list of the current processing task can include AC, AB, and CB.

AB in the processing area relationship list of the to-be-started processing task can be same as the processing area identification of AB in the processing area relationship list of the current processing task. AB in the processing area relationship list of the current processing task can be the processing area group identification corresponding to AB of the processing area relationship list of the to-be-started processing task.

AC of the processing area relationship list of the to-be-started processing task and AC of the processing area relationship list of the current processing task can have a same processing area identification. AC of the processing area relationship list of the current processing task can be the processing area group identification corresponding to AC of the processing area relationship list of the to-be-started processing task.

CB of the processing area relationship list of the to-be-started processing task and BC of the processing area relationship list of the current processing task can have the same processing area identification. BC of the processing area relationship list of the current processing task can be the processing area group identification corresponding to CB of the processing area relationship list of the to-be-started processing task.

AB of the processing area relationship list of the to-be-started processing task can have a same sequence as AB of the processing area relationship list of the current processing task. AC of the processing area relationship list of the to-be-started processing task can have the same sequence as AC in the processing area relationship list of the current processing task. CB of the processing area relation list of the to-be-started processing task can have a different sequence from BC of the processing area relationship list of the current processing task. Therefore, the to-be-started processing task cannot be used as a startable processing task.

For another example, the processing area relationship list of the current processing task can include AB, AC, and BC. The processing area relationship list of the to-be-started processing task can include AB, AC, and BC.

The sequence of AB, AC, and BC in the processing area relationship lists of the current processing task and the to-be-started processing task can be the same. Therefore, the to-be-started processing task can be used as a startable processing task.

It should be noted that the above to-be-started processing task does not specifically refer to a certain to-be-started processing task. A processing area group that is associated with the to-be-started processing task and the current processing task does not specifically refer to a certain processing area group.

In some embodiments, for any to-be-started processing task, a processing area group associated with the to-be-started processing task and the current processing task can be referred to as a processing area group associated with both the to-be-started processing task and the current processing task.

For any one to-be-started processing task, if both the to-be-started processing task and the current processing task involve a processing area group and the state of the processing area group in the to-be-started processing task and the state of the processing area group in the current processing task are not the same, the to-be-started processing task can be determined to not belong to the startable processing task.

For a to-be-started processing task, and for each processing area group associated with the to-be-started processing task and the current processing task, if the state of the processing area group in the to-be-started processing task and the state of the processing area group in the current processing task are the same, the to-be-started processing task can be used as the startable processing task.

In some embodiments, based on the processing area relationship list of the current processing task and the processing area relationship list of each to-be-started processing task, determining whether all the to-be-started processing tasks include the startable processing task according to the first predetermined rule can include, based on the processing area relationship list of the current processing task and the processing area relationship list of each target to-be-started processing task, whether all the target to-be-started processing tasks include the startable processing task can be determined according to the first predetermined rule.

In the present disclosure, when whether the startable processing task exists is determined, if all the to-be-started tasks include at least one target to-be-started processing task, whether all the target to-be-started processing tasks include the startable processing task can only be determined. That is, the startable processing task can only be searched from all the target to-be-started processing tasks. The startable processing task can be from all target to-be-started processing tasks. When at least one startable processing task is found from all the target to-be-started processing tasks, at least one startable processing task can be determined to exist. Correspondingly, all the to-be-started tasks can be determined to include the startable processing task.

In some embodiments, the processing area group identification of each processing area in the semiconductor processing apparatus can correspond to a binary key-value pair. An initial value can be 00, a positive sequence value can be 01, and a reverse sequence value can be 10. Based on this setting, based on the processing area relationship list of the current processing task and the processing area relationship list of each to-be-started processing task, determining whether all the to-be-started processing tasks include the startable processing task according to the first predetermined rule can include performing binary or calculation on the processing area relationship list of each to-be-started processing task and the processing area relationship list of the current processing task to obtain a calculation result of each to-be-started processing task, if a calculation result of a to-be-started processing task includes 11, determining that the to-be-started processing task does not belong to the startable processing task, and if the calculation result of the to-be-started processing task does not include 11, determining that the to-be-started processing task is a startable processing task.

In some embodiments, when the binary or calculation is performed on the processing area relationship list of the to-be-started processing task and the processing area relationship list of the current processing task, for each processing area group identification of the processing area relationship list of the to-be-started processing task, the binary or calibration can be performed on a value of the processing area group identification and a value of the processing area group identification of the processing area relationship list of the current processing task. Thus, a plurality of calculation results of the to-be-started processing task can be obtained.

For example, the processing area relationship list of the current processing task can be represented as {{AB:01}, {AC:01}, {AD:00}, {BC:01}, {BD:00}, {CD:00}}.

A processing area relationship list of a to-be-started processing task can be represented as {{AB:01}, {AC:10}, {AD:00}, {BC:10}, {BD:00}, {CD:00}}.

The binary or calculation can be performed on a value of AB, i.e., 01, of the processing area relationship list of the to-be-started processing task and a value of AB, i.e., 01, of the processing area relationship list of the current processing task to obtain a binary or calculation result of 01.

The binary or calculation can be performed on a value of AC, i.e., 01, of the processing area relationship list of the to-be-started processing task and a value of AC, i.e., 10, of the processing area relationship list of the current processing task to obtain a binary or calculation result of 11.

The binary and calculation can be performed on a value of AD, i.e., 00, of the processing area relationship list of the to-be-started processing task and a value of AD, i.e., 00, of the processing area relationship list of the current processing task to obtain a binary or calculation result of 00. A process of performing the binary or calculation on values of BD and CD can be same, and calculation results can be 00.

The binary and calculation can be performed on a value of BC, i.e., 10, of the processing area relationship list of the to-be-started processing task and a value of BC, i.e., 01, of the processing area relationship list of the current processing task to obtain a binary or calculation result of 11.

All the obtained binary or calculation results can include two 11. Therefore, the to-be-started processing task can be determined to be not able to be used as a startable processing task.

At 104, when all the to-be-started processing tasks include the startable processing task, a target startable processing task is selected from all the startable processing tasks according to a second predetermined rule, and the target startable processing task is started.

In some embodiments, the target startable processing task can be selected from all the startable processing tasks randomly according to the second predetermined rule. After the target processing task is started, the target startable processing task can become the current processing task.

In some optional implementations of embodiments of the present disclosure, the second predetermined rule can include selecting a startable processing task with a longest waiting time from all the startable processing tasks to be used as the target startable processing task.

In some optional implementations of embodiments of the present disclosure, the method can further include, when a current processing task does not exist, starting the to-be-started processing task with the longest waiting time of all the to-be-started processing tasks. For example, at a moment when a task that needs to be started is determined, all the started tasks can be processed. Thus, the current processing task does not exist. The to-be-started processing task with the longest wait time of all the to-be-started processing tasks can be started.

Figure 4:
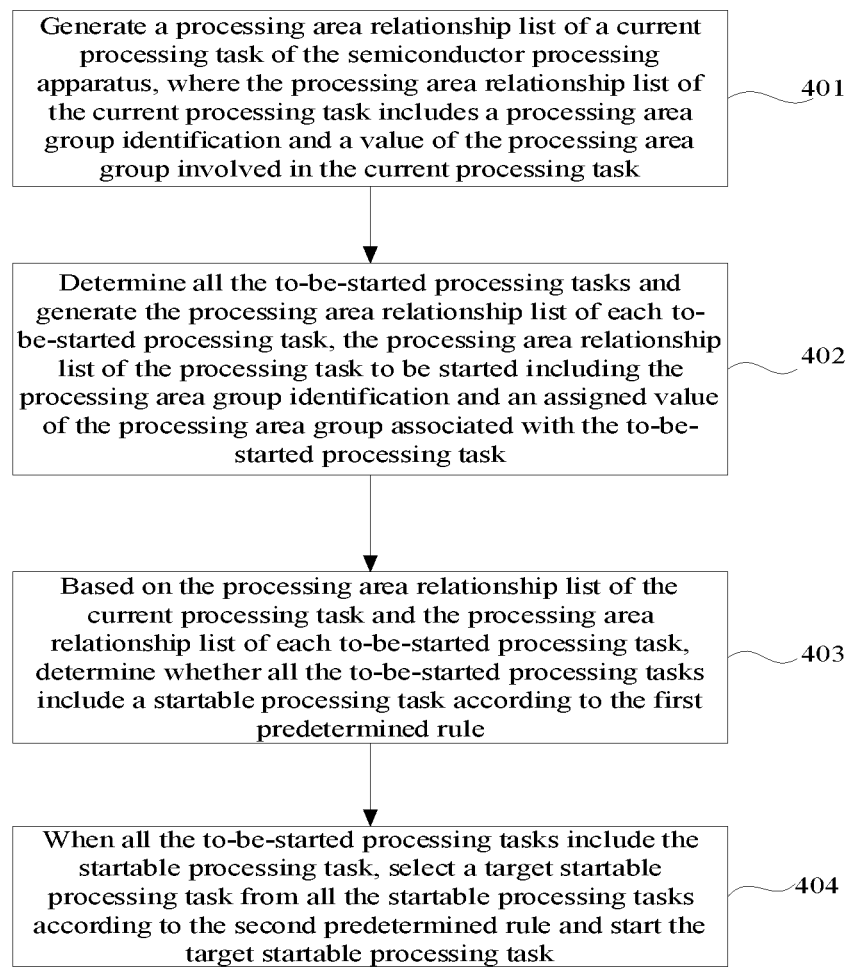
FIG. 4 illustrates a schematic flowchart of a processing task start method in a semiconductor processing apparatus according to a second embodiment of the present disclosure.

FIG. 4 illustrates a schematic flowchart of a processing task start method in a semiconductor processing apparatus according to a second embodiment of the present disclosure. As shown in FIG. 4, the method includes:

at 401, generating a processing area relationship list of a current processing task of the semiconductor processing apparatus, where the processing area relationship list of the current processing task includes a processing area group identification and a value of the processing area group associated with the current processing task.

In some embodiments, generating the processing area relationship list of the current processing task of the semiconductor processing apparatus can include setting a processing area identification for each processing area in the semiconductor processing apparatus, combining the processing area identifications according to an arrangement sequence of the plurality of processing units of the semiconductor processing apparatus to obtain a processing area group identification of each processing area group and generate a processing area group identification list including all the processing area group identifications, assigning an initial value to each processing area group identification, the initial value being used to indicate that the processing area group corresponding to the processing area group identification does not exist, assigning a positive sequence value or a reverse sequence value to the corresponding processing area group identification of the processing area group identification list according to the processing area group associated with the current processing task and the state of the processing area group to obtain the processing area relationship list of the current processing task. The positive sequence value can be used to indicate that the processing area group corresponding to the processing area group identification exists and is in the positive sequence state. The reverse sequence value can be used to indicate that the processing area group corresponding to the processing area group identification exists and is in the reverse sequence state.

When the processing area relationship list of the current processing task is generated, a processing area identification can be set for each processing area of the semiconductor processing apparatus first.

For example, the semiconductor processing apparatus can include processing area A, processing area B, processing area C, and processing area D. The processing area identification of processing area A can be set as A. The processing area identification of processing area B can be set as B. The processing area identification of processing area C can be set as C. The processing area identification of the processing area D can be set as D.

In some embodiments, when the processing area identifications are combined according to the arrangement sequence of the plurality of processing units in the semiconductor processing apparatus, according to the arrangement sequence of the plurality of processing units of the semiconductor processing apparatus, the arrangement sequence of a plurality of processing areas of the semiconductor processing apparatus can be first determined, i.e., the sequence of the plurality of processing areas of the semiconductor processing apparatus from front to back in the semiconductor processing apparatus. The closer to the front the position of the processing unit included in the processing area is, the closer to the front the position of the processing area is.

Taking the cleaning machine as an example, the sequence of all the processing units from front to back can be Tank1, Tank2, Tank3, Tank4, Tank5, Tank6, Tank7, and Tank8.

Tank1-Tank2 can belong to processing area A, Tank3-Tank6 can belong to processing area B, and Tank7-Tank8 can belong to processing area C.

The sequence of the plurality of processing areas from front to back can be processing area A, processing area B, and processing area C.

The sequence from front to back of the processing areas can be consistent with the sequence from front to back of the processing area identifications. Therefore, after the sequence from front to back of the processing areas is determined, the sequence from front to back of the processing area identifications can be determined. Then, the processing area identifications of the processing areas can be combined in the predetermined positive sequence combination manner to obtain the processing area group identification of each processing area group.

The predetermined positive sequence combination method can include, for each processing area identification, when at least one of other processing area identifications exists after the processing area identification, the processing area identification can be combined with each of the other processing area identifications after the processing area identification.

For example, a first processing area identification can be A, a second processing area identification can be B, a third processing area identification can be C, and the fourth processing area identification can be D. That is, the sequence of the plurality of processing areas from front to back can be A, B, C, and D.

The processing area identifications A, B, C, and D can be the other processing area identifications after the processing area identification. A can be combined with each of B, C, and D to obtain processing area group identifications AB, AC, and AD.

The processing area identifications B, C, and D are the other processing area identifications after the processing area identification. B can be combined with each of C and D to obtain BC and BD.

The processing area identifications C and D are the other processing area identifications after the processing area identification. C can be combined with D as CD.

The obtained processing area group identifications of all the processing area groups can include AB, AC, AD, BC, BD, and CD.

After the processing area group identification of each processing area group is obtained, a processing area group identification list including all the processing area group identifications can be generated. The processing area group identification list can be referred to as combineRegionName.

A structure of processing area group identification list combineRegionName can be a List structure in the data structure.

For example, the obtained processing area group identifications of all the processing area groups can include AB, AC, AD, BC, BD, and CD. Processing area group identification list combineRegionName can be represented as: List<string> combineRegionName={AB, AC, AD, BC, BD, CD}.

After the processing area group identification list including all the processing area group identifications is generated, each processing area group identification can be assigned an initial value. The initial value can be used to indicate that the processing area group corresponding to the processing area group identification does not exist.

For example, processing area group identification list combineRegionName can be represented as List<string> combineRegionName={AB, AC, AD, BC, BD, CD}. Each processing area group identification can be assigned the initial value. The initial value can be 00. The obtained data structure can be represented as {{AB:00}, {AC:00}, {AD:00}, {BC:00}, {BD:00}, {CD:00}}.

Then, according to the processing area group associated with the current processing task and the state of the current processing task, the corresponding processing area group identification in the processing area group identification list can be assigned the positive sequence value or the reverse sequence value to obtain the processing area relationship list of the current processing task. The positive sequence value can be used to indicate that the processing area group corresponding to the processing area group identification exists and is in the positive sequence state. The reverse sequence value can be used to indicate that the processing area group corresponding to the processing area group identification exists and is in the reverse sequence state.

In some embodiments, for a processing area group identification, if a processing area group includes processing areas where each processing area identification belongs to two processing area identifications of the processing area group identification, the processing area group can be referred to as the processing area group corresponding to the processing area group identification.

If the processing area group is the processing area group associated with the current processing task, the processing area group can be indicated to exist. If the processing area group is not the processing area group associated with the current processing task, the processing area group can be indicated to not exist.

The state of the processing area group associated with the current processing task can refer to the state of the processing area group associated with the current processing task in the current processing task.

For each processing area group identification of the processing area group associated with the current processing task in the processing area relationship list of the current processing task, if the state of the processing area group where the processing area group identification is the positive sequence state, the processing area group identification can be assigned the positive sequence value. If the state of the processing area group where the processing area group identification belongs is the reverse sequence state in the current processing task, the processing area group identification can be assigned the reverse sequence value.

For example, each processing area group identification can be assigned the initial value. The initial value can be 00. The obtained data structure can be represented as {{AB:00}, {AC:00}, {AD:00}, {BC:00}, {BD:00}, {CD:00}}. Assume that the processing area group identifications of all the processing area groups associated with the current processing task can include AB and AC. The state of the processing area group composed of processing area A and processing area B to which processing area identification AB belongs can be the positive sequence state in the current processing task. The state of the processing area group composed of the processing area A and the processing area C to which processing area identification AC belongs can be the reverse sequence state in the current processing task. Then, AB can be assigned the positive sequence value (for example, 01), and AC can be assigned the reverse sequence value (for example, 10). The obtained processing area relationship list of the current processing task can be represented as {{AB:01}, {AC:10}, {AD:00}, {BC:00}, {BD:00}, {CD:00}}.

Figure 5:
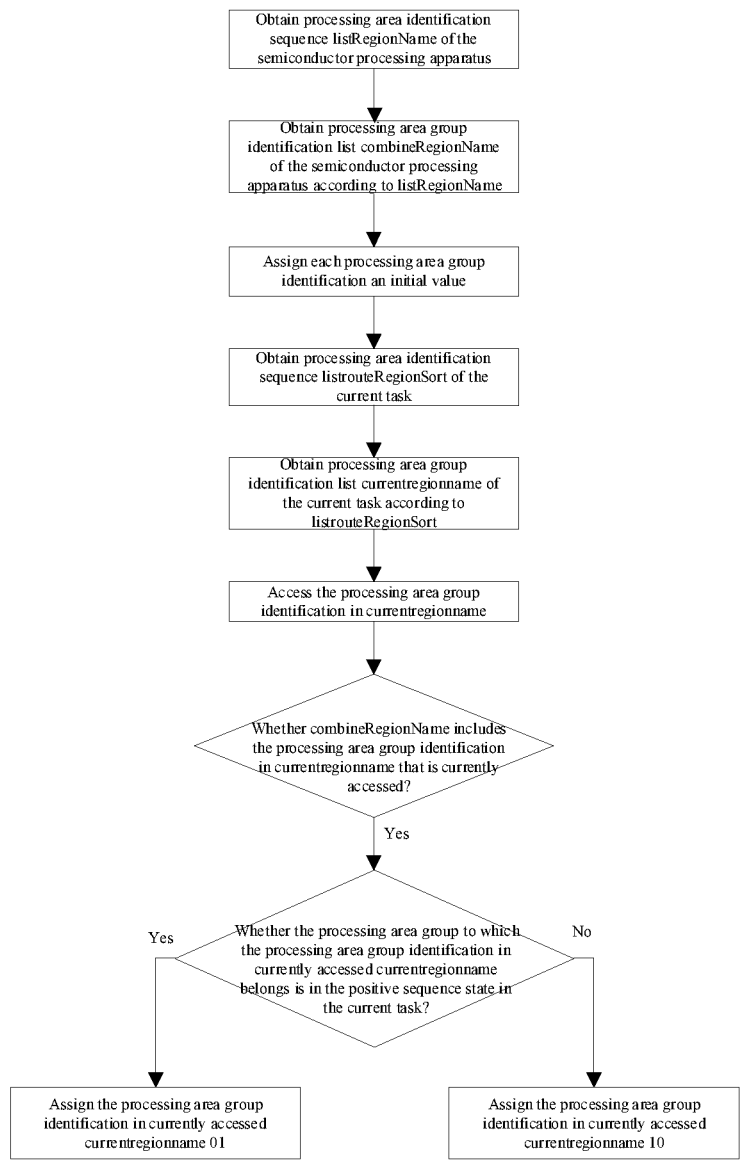
FIG. 5 illustrates a schematic flowchart showing assigning a value for a processing area group identification of a processing area group related to a current processing task.

With reference to FIG. 5, which illustrates a schematic flowchart showing assigning a value for a processing area group identification of a processing area group related to a current processing task.

As shown in FIG. 5, processing area identification sequence listRegionName of the semiconductor processing apparatus is obtained. Processing area group identification list combineRegionName of the semiconductor processing apparatus is obtained according to listRegionName. Each processing area group identification is assigned the initial value. Processing area identification sequence listrouteRegionSort of the current task is obtained. Processing area identification sequence listrouteRegionSort of the current processing task can include the processing area identification of each processing area associated with the current processing task. Processing area group identification list currentregionname of the current processing task is obtained according to listrouteRegionSort. Processing area group identification list currentregionname of the current processing task can include the processing area group identification of each processing area group associated with the current processing task.

The processing area group identification in currentregionname can be traversed. When a processing area group identification is accessed, the processing area group identification can be the currently accessed processing area group identification.

Whether combineRegionName includes the processing area group identification in currently accessed currentregionname can be determined. If combineRegionName includes the processing area group identification in currently accessed currentregionname, whether the state of the processing area group to which the currently accessed processing area group identification in currentregionname belongs is in the positive sequence state in the current processing task can be determined.

If yes, the processing area group identification in currently accessed currentregionname can be assigned 01. If not, the processing area group identification in currently accessed currentregionname can be assigned 10.

At 402, all the to-be-started processing tasks are determined, and the processing area relationship list of each to-be-started processing task is generated. The processing area relationship list of the to-be-started processing task includes the processing area group identification and an assigned value of the processing area group associated with the to-be-started processing task.

In some embodiments, generating the processing area relationship list of each to-be-started processing task can include, according to the processing area group associated with each to-be-started processing task and the state of the processing area group, assigning the positive sequence value or the reverse sequence value to the processing area group identification corresponding to the processing area identification list to obtain the processing area relationship list of each to-be-started processing task.

According to the processing area group associated with the to-be-started processing task and the positive state of the processing area group, the process of obtaining the processing area relationship list of the to-be-started processing task can be similar to the process of obtaining the processing area relationship list of the current processing task according to the processing area group associated with the current processing task and the state of the processing area group. With reference to the processing area group associated with the current processing task and the state of the processing area group, the processing area relationship list of the current processing task can be obtained. according to the processing area group of each to-be-started processing task and the state of the processing area group, the corresponding processing area group identification in the processing area group identification list can be assigned the positive sequence value or the reverse sequence value to obtain the processing area relationship list of each to-be-started processing task.

At 403, based on the processing area relationship list of the current processing task and the processing area relationship list of each to-be-started processing task, whether all the to-be-started processing tasks include a startable processing task can be determined according to the first predetermined rule.

In some embodiments, the processing area group identification of each processing area in the semiconductor processing apparatus can correspond to the binary key-value pair. The initial value can be 00, the positive sequence value can be 01, and the reverse sequence value can be 10. Based on this setting, based on the processing area relationship list of the current processing task and the processing area relationship list of each to-be-started processing task, determining whether all the to-be-started processing tasks include the startable processing task according to the first predetermined rule can include performing the binary or calculation on the processing area relationship list of each to-be-started processing task and the processing area relationship list of the current processing task to obtain the calculation result of each to-be-started processing task, if a calculation result of a to-be-started processing task includes 11, determining that the to-be-started processing task does not belong to the startable processing task, and if the calculation result of the to-be-started processing task does not include 11, determining that the to-be-started processing task is a startable processing task.

In some embodiments, when the binary or calculation is performed on the processing area relationship list of the to-be-started processing task and the processing area relationship list of the current processing task, for each processing area group identification of the processing area relationship list of the to-be-started processing task, the binary or calibration can be performed on the value of the processing area group identification and the value of the processing area group identification of the processing area relationship list of the current processing task. Thus, the plurality of calculation results of the to-be-started processing task can be obtained.

For example, the processing area relationship list of the current processing task can be represented as {{AB:01}, {AC:01}, {AD:00}, {BC:01}, {BD:00}, {CD:00}}.

A processing area relationship list of a to-be-started processing task can be represented as {{AB:01}, {AC:10}, {AD:00}, {BC:10}, {BD:00}, {CD:00}}.

The binary or calculation can be performed on a value of AB, i.e., 01, of the processing area relationship list of the to-be-started processing task and a value of AB, i.e., 01, of the processing area relationship list of the current processing task to obtain a binary or calculation result of 01.

The binary or calculation can be performed on a value of AC, i.e., 01, of the processing area relationship list of the to-be-started processing task and a value of AC, i.e., 10, of the processing area relationship list of the current processing task to obtain a binary or calculation result of 11.

The binary and calculation can be performed on a value of AD, i.e., 00, of the processing area relationship list of the to-be-started processing task and a value of AD, i.e., 00, of the processing area relationship list of the current processing task to obtain a binary or calculation result of 00. A process of performing the binary or calculation on values of BD and CD can be same, and calculation results can be 00.

The binary and calculation can be performed on a value of BC, i.e., 10, of the processing area relationship list of the to-be-started processing task and a value of BC, i.e., 01, of the processing area relationship list of the current processing task to obtain a binary or calculation result of 11.

All the obtained binary or calculation results can include two 11. Therefore, the to-be-started processing task can be determined to be not able to be used as a startable processing task.

At 404, when all the to-be-started processing tasks include the startable processing task, a target startable processing task is selected from all the startable processing tasks according to the second predetermined rule, and the target startable processing task is started.

An execution process of step 404 can be similar to an execution process of step 104 described above. The execution process of step 404 can refer to the execution process of step 104 described above.

Figure 6:
FIG. 6 illustrates a schematic flowchart of a target startable processing task in the first cleaning machine.

With reference to FIG. 6, which illustrates a schematic flowchart of a target startable processing task in the first cleaning machine.

Whether a current job that is being executed can be determined. Determining whether the current job that is being executed is equivalent to determining whether the current job is in the execution state. The current job that is being executed can refer to the task whose specified material is being processed in the processing unit and has the latest start time.

If the current job that is being executed exists, the current job that is being executed can be obtained in T3-T6 processing areas, that is, the serial-parallel mode of processing area B.

Whether the serial-parallel mode of the current job that is being executed in processing areas T3-T6 is void can be determined. If the serial-parallel mode of the current job that is being executed in processing areas T3-T6 is not void, the to-be-started job with the serial-parallel mode of processing area B at processing areas T3-T6 being consistent with the serial-parallel mode of the current job at processing areas T3-T6 can be searched. Joblist1 with the consistent serial-parallel mode can be generated. If the to-be-started job with the serial-parallel mode of processing area B at processing areas T3-T6 being consistent with the serial-parallel mode of the current job at processing areas T3-T6 does not exist, Joblist1 can be void. If the to-be-started job with the serial-parallel mode of processing area B at processing areas T3-T6 being consistent with the serial-parallel mode of the current job at processing areas T3-T6 exists, Joblist1 cannot be void. If Joblist1 is not void, the processing area relationship list of the current job that is being executed can be obtained. according to the processing area relationship list of the current job that is being executed and the processing area relationship list of the to-be-started task in Joblist1, the startable job can be searched. That is, the to-be-started job can be searched from the to-be-started job with the serial-parallel mode of processing area B at processing area T3-T6 being consistent with the serial-parallel mode of the current job at processing areas T3-T6. List Joblist2 of the startable processing tasks can be generated. If no startable job is found, Joblist2 can be void. If at least one startable job is found, Joblist2 cannot be void. Joblist2 can include all found startable jobs. If Joblist2 is not void, the startable job with the longest wait time in Joblist 2 can be selected as the target startable processing task. The target startable processing task can be started.

If the current job that is being executed exists, and the serial-parallel mode of the current job that is being executed in processing areas T3-T6, that is, processing area B, is void, a list Joblist3 related to the to-be-started job with the serial-parallel mode at processing areas T3-T6 being void, Joblist 3 can be void. If at least one to-be-started job with the serial-parallel mode at processing areas T3-T6 being void exists, Joblist3 cannot be void. If Joblist3 is not void, the processing area relationship list of the current job that is being executed can be obtained. According to the current job that is being executed and the processing area relationship list of the to-be-started job with the serial-parallel mode being void at processing areas T3-T6, the startable job can be searched. List Joblist4 of the startable processing task can be generated. If the startable job of the to-be-started job with the serial-parallel mode being void at processing areas T3-T6 is not found, Joblist4 can be void. If the startable job of the to-be-started job with the serial-parallel mode being void at processing areas T3-T6 is found, Joblist4 cannot be void.

If Joblist4 is not void, the startable job with the longest wait time from the startable jobs of all the jobs to be started with the serial-parallel mode being void at processing areas T3-T6 can be selected as the target startable processing task. The target startable processing task can be started.

If the current job that is being executed does not exist, whether a NewJobID exists can be determined. NewJobID can represent a processing task newly started by the semiconductor processing apparatus. The processing task newly started by the semiconductor processing apparatus can refer to the task whose material has not left the Foup and has the latest start time of the tasks that have been already started. When the current job that is being executed does not exist, and NewJobID exists, NewJobID can be used as the current Job.

If NewJobID exists, the processing area relation list of NewJobID can be obtained. According to NewJobID and the processing area relationship list of each to-be-started task with the serial-parallel mode at processing areas T3-T6 being consistent with the serial-parallel mode of NewJobID at processing areas T3-T6, the startable job can be searched. A list Joblist5 of the startable processing tasks can be generated. If the startable job is not found, Joblist5 can be void. If at least one Startable job is found, Joblist5 cannot be void. If Joblist5 is not void, the startable job with the longest wait time in Joblist5 can be selected as the target startable processing task. The target startable processing task can be started, and NewJobID can be updated. The started target startable processing task has not left Foup and has the latest start time. Thus, the started target processing task can become new NewJobID.

If NewJobID does not exist, whether the to-be-started job with the longest wait time exists can be determined. If the to-be-started job with the longest wait time, the startable job with the longest wait time can be selected as the target startable processing task. The target startable processing task can be started. New NewJobID can be updated.

Figure 7:
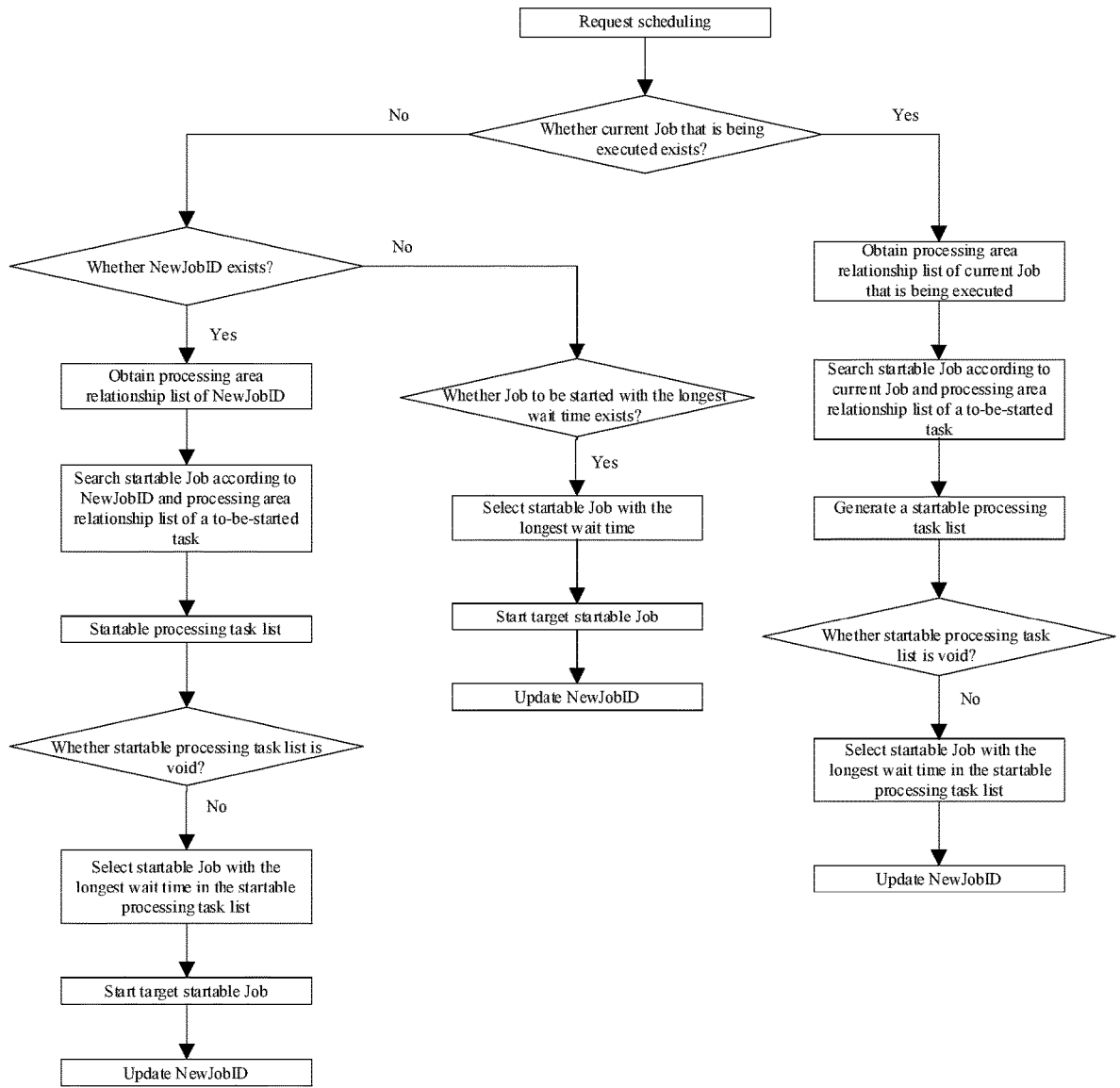
FIG. 7 illustrates a schematic flowchart of a target startable processing task in the second cleaning machine.

With reference to FIG. 7, which illustrates a schematic flowchart of a target startable processing task in the second cleaning machine.

Whether the current job that is being executed exists can be determined. Determining whether the current job that is being executed can be equivalent to determining whether the current job that is in the execution state. The current job that is being executed may refer to the task whose specified material is being processed in the processing unit and has the latest start time.

If the current job that is being executed exists, the processing area relationship list of the current job that is being executed can be obtained. According to the processing area relationship list of the current job that is being executed and the processing area relationship list of each to-be-started task, the startable job can be searched. A list of the startable processing task can be generated. If the startable job is not found, it is void. If at least one startable job is found, the list of the startable processing task cannot be void, including all the found startable jobs. If the list of the startable processing tasks is not void, the startable job with the longest wait time of the list of the startable processing task can be selected as the target startable processing task. The target startable processing task can be started.

If the current job that is being executed does not exist, whether the NewJobID exists can be determined. If NewJobID exists, the processing area relationship list of NewJobID can be obtained. According to the processing area relationship list of NewJobID and the processing area relationship list of each to-be-started task, the startable job can be searched. The list of the startable processing tasks can be generated. If the startable job is not found, the list of the startable processing tasks can be void. If at least one startable job is found, the list of the startable processing tasks cannot be void, including all the found startable jobs. If the list of the startable processing task is not void, the startable job with the longest wait time in the list of the startable processing tasks can be used as the target startable processing task. The target startable processing task can be started. NewJobID can be updated.

If NewJobID does not exist, whether the to-be-started job with the longest wait time can be determined. If the to-be-started job with the longest wait time exists, the startable job with the longest wait time as the target startable processing task. The target startable processing task can be started. NewJobID can be updated.

Figure 8:
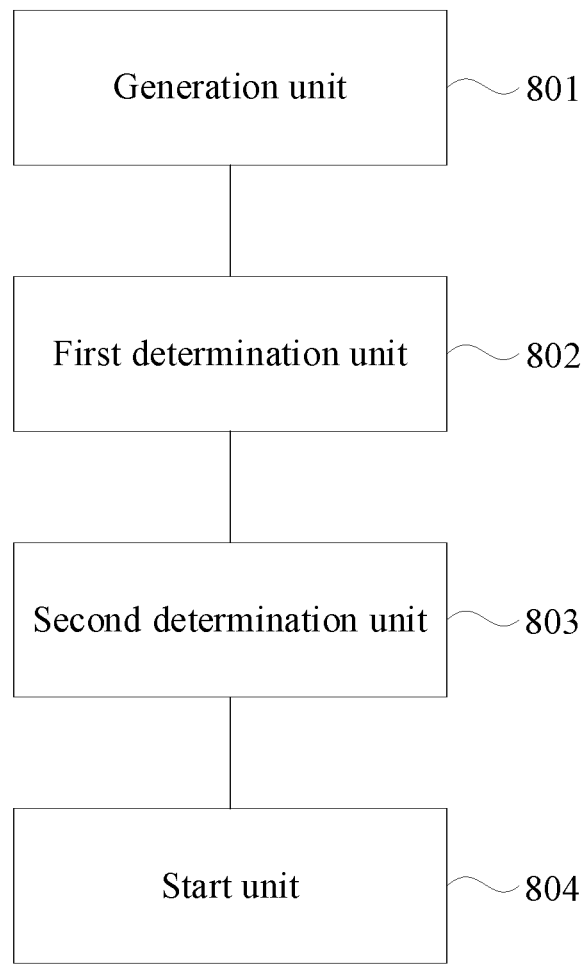
FIG. 8 illustrates a structural block diagram of a processing task start device in the semiconductor processing apparatus according to some embodiments of the present disclosure.

With reference to FIG. 8, which illustrates a structural block diagram of a processing task start device in the semiconductor processing apparatus according to some embodiments of the present disclosure. The start device of the processing tasks in the semiconductor processing apparatus includes a generation unit 801, a first determination unit 802, a second determination unit 803, and a start unit 804.

The generation unit 801 can be configured to generate a processing area relationship list of the current processing task of the semiconductor processing apparatus. The processing area relationship list of the to-be-started processing task can include the processing area group identifications of all the processing area groups associated with the current processing task;

The first determination unit 802 can be configured to determine all the to-be-started processing tasks and generate the processing area relationship list of each to-be-started processing task. The processing area relationship list of the to-be-started processing tasks can include all the processing area groups associated with the to-be-started processing tasks and the processing area group identification of all the processing area groups.

The second determination unit 803 can be configured to, based on the processing area relationship list of the current processing task and the processing area relationship list of each to-be-started processing task, determine whether all the to-be-started processing tasks include the startable processing task according to the first predetermined rule.

The start unit 804 can be configured to, when all the to-be-started processing tasks include the startable processing task, select the target startable processing task from all the startable processing tasks, and start the target startable processing task.

In some embodiments, the first determination unit 802 can be further configured to, when the current processing task involves a predetermined process area of the plurality of processing areas associated with the current processing task, determine the serial-parallel mode corresponding to the predetermined processing area of the current processing task, determine the to-be-started processing task of all the to-be-started processing task associated with the predetermined processing area, determine the serial-parallel mode corresponding to the predetermined processing area of each of the to-be-started processing task associated with the predetermined processing area, determine the to-be-started processing task associated with the predetermined processing area and with the serial-parallel mode corresponding to the predetermined processing area matching the serial-parallel mode corresponding to the predetermined processing area of the current processing task as the target startable processing task, and generated the processing area relationship list of each target to-be-started processing task.

In some embodiments, the second determination unit 803 can be further configured to, based on the processing area relationship list of the current processing task and the processing area relationship list of each target to-be-started processing task, determine whether all the target to-be-started processing tasks include the startable processing task according to the first predetermined rule.

In some embodiments, the second predetermined rule can include selecting the startable processing task with the longest wait time from all the startable processing tasks as the target startable processing task.

In some embodiments, the current processing task can include one of the processing task that is being executed by the semiconductor processing apparatus and the processing task newly started by the semiconductor processing apparatus.

In some embodiments, the generation unit 801 can be further configured to set a processing area identification for each processing area, combine the processing area identifications according to an arrangement sequence of the plurality of processing units to obtain the processing area group identification of each processing area group and generate the processing area group identification list including all the processing area group identifications, assign each processing area group identification the initial value, the initial value being used to indicate that the processing area group corresponding to the processing area group identification does not exist, according to the processing area group associated with the current processing task and the positive or reverse sequence state, assign the corresponding processing area group identification in the processing area group identification list the positive sequence value or the reverse sequence value to obtain the processing area relationship list of the current processing task. The positive sequence value can be used to indicate that the processing area group corresponding to the processing area group identification exists and is in the positive sequence state. The reverse sequence value can be used to indicate that the processing area group corresponding to the processing area group identification exists and is in the reverse sequence state.

In some embodiments, the first determination unit 802 can be further configured to assign the corresponding processing area group identification in the processing area group identification list the positive sequence value or the reverse sequence value to obtain the processing area relationship list of each to-be-started processing task according to the processing area group associated with each to-be-started processing task and the state of the processing area group.

In some embodiments, the first predetermined rule can include, if a to-be-started processing task and the current processing task both are associated with a processing area group, and the state of the processing area group in the to-be-started processing task and the current processing task is different, the to-be-started processing task does not belong to the startable processing task, otherwise, the to-be-started processing task belongs to the startable processing task.

In some embodiments, each processing area group identification can correspond to a binary key-value pair. The initial value can be 00, the positive sequence value can be 01, and the reverse sequence value can be 10. The second determination unit 803 can be further configured to perform binary or calculation on the processing area relationship list of each to-be-started processing task and the processing area relationship list of the current processing task to obtain the calculation result of each to-be-started processing task, if the calculation result of the to-be-started processing task includes 11, determining that the to-be-started processing task does not belong to the startable processing task, and if the calculation result of the to-be-started processing task does not include 11, determining that the to-be-started processing task is a startable processing task.

Those skilled in the art can think of other embodiments of the present disclosure after considering the disclosure disclosed in the specification and practice. The present disclosure is intended to cover any variations, uses, or adaptations of the present disclosure. These variations, uses, or adaptations follow the general principle of the present disclosure and include common knowledge or conventional techniques in the technical field not disclosed in the present disclosure. The specification and embodiments are merely regarded as exemplary. The actual scope and spirit of the present disclosure are indicated by the following claims.

It can be understood that the present disclosure is not limited to the precise structure described above and shown in the accompanying drawings. Various modifications and changes can be made to the present disclosure without departing from the scope thereof. The scope of the present application is limited only by the appended claims.

What is claimed is:

1. A start method of a processing task in a semiconductor processing apparatus, wherein the semiconductor processing apparatus includes a plurality of processing units arranged in sequence, the plurality of processing units are divided into a plurality of processing areas, and the plurality of processing areas are combined into a plurality of processing area groups in an arrangement sequence of the plurality of processing units, the method, comprising:
   generating a processing area relationship list of a current processing task of the semiconductor processing apparatus, wherein the processing area relationship list of the current processing task includes processing area group identifications of all processing area groups involved in the current processing task;
   determining all to-be-started processing tasks and generating a processing area relationship list for each of the to-be-started processing tasks, wherein the processing area relationship list of the to-be-started processing task includes the processes of processing area group identifications of all processing area groups involved in the to-be-started processing task;
   based on the processing area relationship list of the current processing task and the processing area relationship list of each of the to-be-started processing tasks, determining whether all the to-be-started processing tasks include a startable processing task according to a first predetermined rule; and
   when all the to-be-started processing tasks include the startable processing task, selecting a target startable processing task from all startable processing tasks according to a second predetermined rule and starting the target startable processing task.

2. The method according to claim 1, wherein the first predetermine rule includes:
   in response to both a to-be-started processing task and the current processing task being associated with a processing area group, and a state of the processing area group being different in the to-be-started processing task and the current processing task, the to-be-started processing task not belonging to the startable processing task, otherwise the to-be-started processing task belonging to the startable processing task;
   wherein:
      the state includes a positive sequence state and a reverse sequence state;
      the positive sequence state indicates that a before-after relationship of the processing area group in a corresponding processing task is consistent with a before-after relationship in the semiconductor processing apparatus; and
      the reverse sequence state indicates that the before-after relationship of the processing area group in the corresponding processing task is inconsistent with the before-after relationship in the semiconductor processing apparatus.

3. The method according to claim 1, wherein determining all the to-be-started processing tasks and generating the processing area relationship list of each of the to-be-started processing tasks includes:
   in response to the current processing task involving a predetermined processing area of the plurality of processing areas, determining a serial-parallel type corresponding to the predetermined processing area in the current processing task;
   determining a to-be-started processing task of all the to-be-started processing tasks associated with the predetermined processing area;
   determining a serial-parallel type corresponding to the predetermined processing area in each of the to-be-started processing tasks associated with the predetermined processing area;
   determining a to-be-started processing task associated with the predetermined processing area and with a serial-parallel type corresponding to the predetermined processing area matching a serial-parallel type corresponding to the predetermined processing area in the current processing task as a target to-be-started processing task; and
   generating a processing area relationship list of each target to-be-started processing task.

4. The method according to claim 3, wherein based on the processing area relationship list of the current processing task and the processing area relationship list of each of the to-be-started processing tasks, determining whether all the to-be-started processing tasks include the startable processing task according to the first predetermined rule includes:
   based on the processing area relationship list of the current processing task and the processing area relationship list of each of the target to-be-started processing tasks, determining whether all the target to-bestarted processing tasks include the startable processing task according to the first predetermined rule.

5. The method according to claim 1, wherein the second predetermined rule includes:
   selecting a startable processing task with a longest wait time from all the startable processing tasks as the target startable processing task.

6. The method according to claim 1, wherein the current processing task includes one of a processing task that is being executed by the semiconductor processing apparatus and a processing task newly started by the semiconductor processing apparatus.

7. The method according to claim 2, wherein generating the processing area relationship list of the current processing task of the semiconductor processing apparatus includes:
   setting a processing area identification for each of the processing areas;
   combining the processing area identifications according to the arrangement sequence of the plurality of processing units to obtain a processing area group identification of each of the processing area groups and generating the processing area group identification list including all the processing area group identifications;
   assigning each of the processing area group identifications an initial value, wherein the initial value is used to indicate that a processing area group corresponding to a processing area group identification does not exist; and
   according to the processing area group involved in the current processing task and the state of the processing area group, assigning the corresponding processing area group identification in the processing area group identification list a positive sequence value or a reverse sequence value to obtain the processing area relationship list of the current processing task, wherein:
      the positive sequence value is used to indicate that the processing area group corresponding to the processing area group identification exists and is in the positive sequence state; and
      the reverse sequence value is used to indicate that the processing area group corresponding to the processing area group identification exists and is in the reverse sequence state.

8. The method according to claim 7, wherein generating the processing area relationship list of each of the to-be-started processing tasks includes:
   according to the processing area group involved in each of the to-be-started processing tasks and the state of the processing area group, assigning the corresponding processing area group identification in the processing area group identification list the positive sequence value or the reverse sequence value to obtain the processing area relationship list of each of the to-be-started processing tasks.

9. The method according to claim 8, wherein:
   each of the processing area group identifications corresponds to a binary key-value pair, the initial value is 00, the positive sequence value is 01, and the reverse sequence value is 10; and based on the processing area relationship list of the current processing task and the processing area relationship list of each of the to-be-started processing tasks, determining whether all the to-be-started processing tasks include the startable processing task according to the first predetermined rule includes:
   performing binary OR calculation on the processing area relationship list of each of the to-be-started processing tasks and the processing area relationship list of the current processing task to obtain a calculation result of each of the to-be-started processing tasks:
      if the calculation result of the to-be-started processing task includes 11, determining that the to-be-started processing task does not belong to the startable processing task;
      if the calculation result of the to-be-started processing task does not include 11, determining that the to-be-started processing task is a startable processing task.

10. A start device of a processing task in a semiconductor processing apparatus, wherein the device is mounted at the semiconductor processing apparatus, the semiconductor processing apparatus includes a plurality of processing units arranged in sequence, the plurality of processing units are divided into a plurality of processing areas, and the plurality of processing areas are combined into a plurality of processing area groups according to an arrangement sequence of the plurality of processing units, the device comprising:
   a generation unit configured to generate a processing area relationship list of a current processing task of the semiconductor processing apparatus, wherein the processing area relationship list of the current processing task includes processing area group identifications of all processing area groups involved in the current processing task;
   a first determination unit configured to determine all to-be-started processing tasks and generate a processing area relationship list for each of the to-be-started processing tasks, wherein the processing area relationship list of the to-be-started processing task includes the processes of processing area group identifications of all processing area groups involved in the to-be-started processing task;
   a second determination unit configured to, based on the processing area relationship list of the current processing task and the processing area relationship list of each of the to-be-started processing tasks, determining whether all the to-be-started processing tasks include a startable processing task according to a first predetermined rule; and
   a start unit configured to, when all the to-be-started processing tasks include the startable processing task, selecting a target startable processing task from all startable processing tasks according to a second predetermined rule and starting the target startable processing task.

* * * * *